United States Patent [19]
Cheng et al.

[11] Patent Number: 6,001,704
[45] Date of Patent: Dec. 14, 1999

[54] METHOD OF FABRICATING A SHALLOW TRENCH ISOLATION BY USING OXIDE/OXYNITRIDE LAYERS

[75] Inventors: Hsu-Li Cheng; Erik S. Jeng, both of Hsinchu; Wei-Ray Lin, Taipei, all of Taiwan

[73] Assignee: Vanguard International Semiconductor Corporation, Taiwan

[21] Appl. No.: 09/090,720

[22] Filed: Jun. 4, 1998

[51] Int. Cl.⁶ ............... H01L 21/76; H01L 21/425
[52] U.S. Cl. ............... 438/410; 438/414; 438/524
[58] Field of Search .................. 438/407, 410, 438/414, 524, 587, 562

[56] References Cited

U.S. PATENT DOCUMENTS

| | | | |
|---|---|---|---|
| 4,694,561 | 9/1987 | Lebowitz | 437/52 |
| 4,791,073 | 12/1988 | Nagy et al. | 437/67 |
| 5,068,202 | 11/1991 | Crotti et al. | 437/67 |
| 5,296,719 | 3/1994 | Hirai et al. | 257/14 |
| 5,492,858 | 2/1996 | Bose et al. | 437/67 |
| 5,643,822 | 7/1997 | Furukawa et al. | 437/67 |
| 5,696,019 | 12/1997 | Furukawa et al. | 437/67 |
| 5,721,172 | 2/1998 | Jang et al. | 438/24 |
| 5,747,359 | 5/1998 | Yuan et al. | 437/186 |
| 5,795,801 | 8/1998 | Lee | 438/199 |

*Primary Examiner*—John F. Niebling
*Assistant Examiner*—Michael S. Lebentritt
*Attorney, Agent, or Firm*—Christensen, O'Connor, Johnson & Kindness PLLC

[57] ABSTRACT

A stacked layer including a first oxide, a nitride layer, a second oxide layer and an oxynitride layer is formed on the top of the first oxide layer. An etching is performed through a photoresist to etch the oxynitride, the second oxide and nitride. Oxide spacers are formed on the side walls of the pattern structure, the oxynitride layer is also removed during the formation of the oxide spacers. Trenches are generated by a dry etching technique. The second oxide and the oxide spacers are removed. Next, a thermal oxidation is performed to rounding the corners of the trench openings. A gap filling material is refilled into the trenches and formed on the nitride. Next, a chemical mechanical polishing (CMP) is used to remove the top of the CVD-oxide and the nitride layer. The residual nitride layer, the CVD-oxide and pad oxide are removed to create trench isolation structures with rounding corners.

15 Claims, 4 Drawing Sheets

METHOD OF FABRICATING A SHALLOW TRENCH ISOLATION BY USING OXIDE/ OXYNITRIDE LAYERS

FIELD OF THE INVENTION

The present invention relates generally to semiconductor processing, and more specifically, to a method for forming a shallow trench isolation.

BACKGROUND OF THE INVENTION

Isolation structures are necessary in a semiconductor wafer in order to isolate individual devices formed in the wafer. Several different isolation technologies have been proposed, including LOCOS (LOCal Oxidation of Silicon), shallow trench isolation (STI), LOCOS-based isolation such as poly-buffered LOCOS (PBL), and framed-mask PBL technologies. In that technique, isolation structures are created by thermally growing a thick field oxide layer over certain areas defined by a silicon nitride mask. Then, the silicon nitride mask is stripped.

As device geometry has shrunk to the sub-half micron order, conventional LOCOS isolation cannot meet the requirements of ULSI fabrication. The major drawback of LOCOS is the "bird's beak" effect. In this effect, the oxidant laterally diffuses at the edges of the silicon nitride during the formation of the isolation. Oxide forms under the nitride edges and lifts the nitride edges. This lateral extension of the field oxide causes unacceptably large encroachment on the field oxide into the device active regions. Further, the planarity of the surface topography is inadequate for sub-micron lithography needs.

Therefore, trench isolation offers potentially great advantages over LOCOS. Hence, STI can be considered as a replacement for conventional LOCOS isolation. Further, STI is gaining popularity for quarter-micron technology. In the basic STI technology, shallow trenches are formed in the silicon substrate by etching. Next, a gap filling material is refilled into the trenches and is then planarized by CMP (Chemical Mechanical Polishing) or etching back.

A variety of issues are generated during the development of this technology. For example, the dishing effect is one of the major issues. The dishing effect adversely impacts the planarity of a layer and impacts the control of lithography and ion implantation. The dishing effect is caused by chemical mechanical polishing that exhibits pattern-dependent polishing uniformity and instability of polishing rate.

One prior art approach to this issue is by the use of a dummy pattern. The use of this conventional method can improve the result of the CMP planarization. However, as seen in FIG. 1, the completed trench isolations 3 in the wafer 1 have shoulder recessed portions 5 formed at the edges of the structure. The shoulder recessed portions 5 will give rise to abnormal electrical characteristics in the devices. Therefore, what is required is a method of forming a trench isolation without shoulder recessed portions.

SUMMARY OF THE INVENTION

A method of forming trench isolations in a silicon wafer is disclosed. The method comprises: forming a first oxide layer on said silicon wafer to act as a pad oxide; forming a silicon nitride layer on said pad oxide; forming a second oxide layer on said silicon nitride layer; forming a silicon oxynitride layer on said second oxide layer; patterning and etching said silicon oxynitride layer, said second oxide layer and said silicon nitride layer to expose said first oxide layer to define areas for forming said trenches; forming oxide spacers on the side walls of said second oxide layer and said silicon nitride layer, wherein said silicon oxynitride layer being removed during the oxide spacers formation; etching said wafer to generate said trenches by using said second oxide layer, said silicon nitride layer and said oxide spacers as an etching mask; removing said oxide spacers and said second oxide layer, leaving said silicon nitride layer and said first oxide layer over said wafer; performing a thermal oxidation step for rounding the corners of said trenches; forming a gap filling material refilled into said trenches and over said silicon nitride and said first oxide layer; performing a chemical mechanical polishing to remove a portion of said gap filling material and leaving a portion of said silicon nitride layer and said first oxide layer over said wafer; and removing said portion of said silicon nitride layer; immersing said wafer in a wet etching solution to remove a portion of said gap filling material over a surface of said wafer, and removing said portion of said first oxide layer, thereby generating said trench isolations with rounding corners.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclosed to fabricate a shallow trench isolation (STI) by using oxide and silicon oxynitride layers. An additional silicon oxynitride layer is used to expand the photolithography process window. Further, the present invention forms further oxide spacers for providing better controllability on STI corner rounding. The oxide between the silicon oxynitride can avoid silicon nitride shoulder loss during the silicon etching. As will be seen below, this technique can be used for manufacturing shallow trench isolation.

Figure 1:
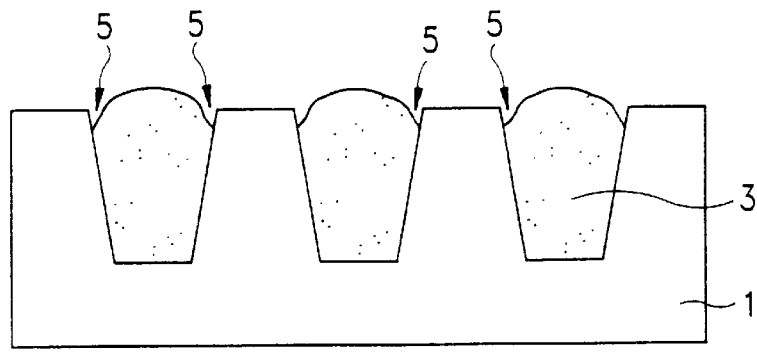
FIG. 1 is a cross section view of a semiconductor wafer illustrating a shoulder recess in accordance with the prior art.
Figure 2:
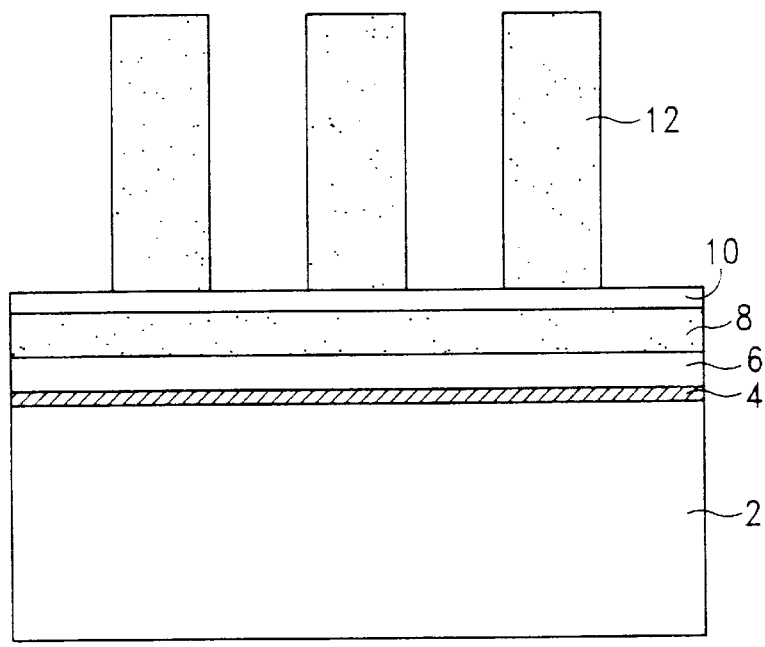
FIG. 2 is a cross section view of a semiconductor wafer illustrating the step of forming a stacked layer in accordance with the present invention.

Referring to FIG. 2, in the preferred embodiment, a semiconductor wafer, such as a silicon wafer 2 with <100> crystallographic orientation is provided. A thin silicon dioxide layer 4 is formed on the wafer 2 to act as a pad layer. The silicon dioxide 4 is typically formed by using a thermal oxidation in an oxygen ambient. Next, a layer of silicon nitride layer 6 is deposited. For example, the silicon dioxide layer 4 is formed by using an oxygen-steam ambient, at a temperature of about 800–1100° C. Alternatively, the oxide layer 4 may be formed using any suitable chemical vapor deposition. In this case, the thickness of the silicon dioxide layer is approximately 50–500 angstroms. The silicon nitride layer 6 can be deposited by any suitable process. The thickness of the silicon nitride layer is about 500 to 2000 angstroms. Further, the temperature used to form the silicon nitride layer 6 is at a range of 500 to 1000 degrees centigrade. In the preferred embodiment, the reaction gases of the step to form silicon nitride layer 6 are selected from $SiH_4$, $NH_3$, $N_2$, $N_2O$ or $SiH_2Cl_2$, $NH_3$, $N_2$, $N_2O$. A further layer 8 of silicon oxide having a thickness about 500 to 1000 angstroms is then formed on the silicon nitride layer 6 as depicted in FIG. 1. The oxide layer 8 can avoid silicon nitride shoulder loss during silicon etching.

Next, a silicon oxynitride layer 10 is formed on the top of the oxide layer 8 to serve as an anti-reflective coating. Preferably, the thickness of the layer is about 100 to 500 angstroms. Typically, this layer can be formed by chemical vapor deposition in NO or $N_2O$ ambient.

Figure 3:
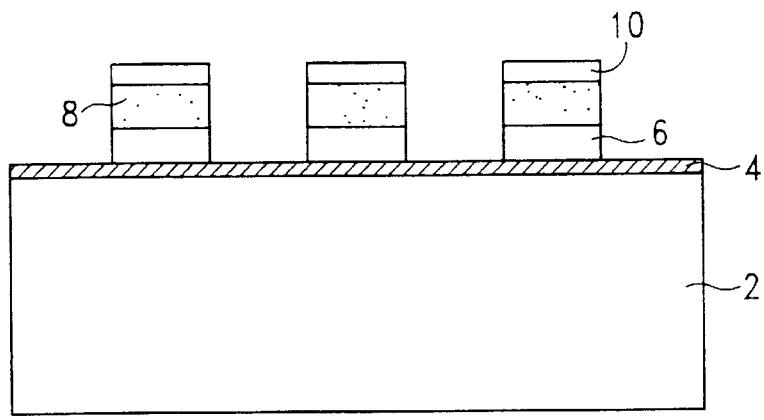
FIG. 3 is a cross section view of a semiconductor wafer illustrating the step of patterning the stacked layer in accordance with the present invention.

Referring to FIG. 2, the areas where the isolations are formed are photolithographically defined over the wafer 2. By using the conventional procedures of photoresist coating, exposing and developing, a photoresist pattern 12 is patterned on the silicon oxynitride layer 10 to define the isolation region. Turning to FIG. 3, an etching is then performed through the photoresist pattern 12 to etch the silicon oxynitride layer 10, oxide layer 8 and silicon nitride layer 6 until exposing the pad oxide layer 4 and subsequently removing the residual masking photoresist pattern 12. The silicon oxynitride layer 10, the oxide 8 and silicon nitride layer 6 can be etched away using well known conventional techniques.

Figure 4:
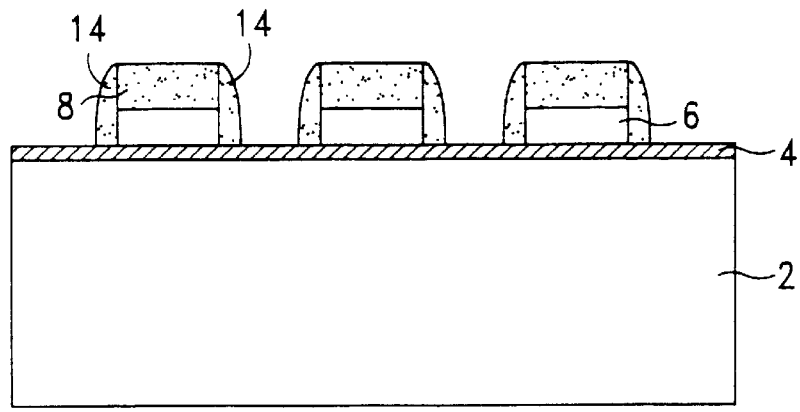
FIG. 4 is a cross section view of a semiconductor wafer illustrating the step of forming oxide spacers in accordance with the present invention.

Referring to FIG. 4, a further oxide layer 14 is formed on the patterned structure and the pad oxide layer 4 by chemical vapor deposition using TEOS as reaction source, which is referred to as TEOS-oxide. Subsequently, an anisotropic etched is carried out to etch the TEOS-oxide layer 14, thereby generating oxide spacers 14 on the side walls of the pattern structure consisting of silicon nitride 6, oxide 8 and silicon oxynitride 10. The silicon oxynitride layer 10 is also removed during the formation of the spacers. This can avoid the stress issue generated by subsequent thermal process. As will be seen below, the oxide spacers provide the controllability on STI corner rounding.

Figure 5:
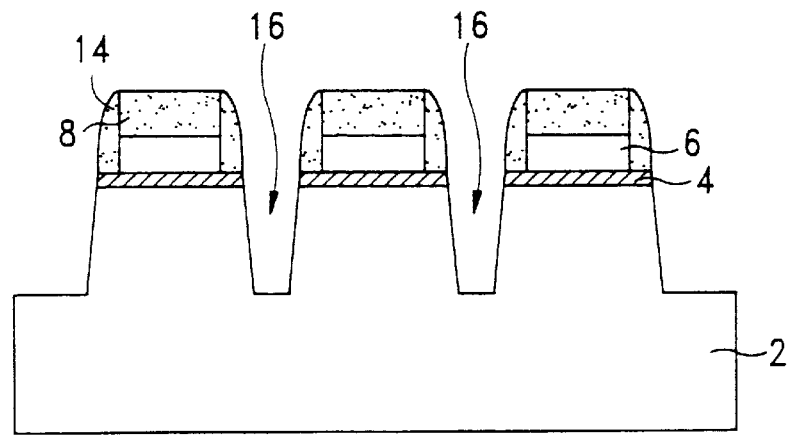
FIG. 5 is a cross section view of a semiconductor wafer illustrating the step of forming trenches in accordance with the present invention.

Turning to FIG. 5, a plurality of shallow trenches 16 are subsequently generated by a dry etching technique using the patterned structure and oxide sidewall spacers 14 as an etching mask. In this case, the dry etching uses $CF_4+O_2$ plasma.

Figure 6:
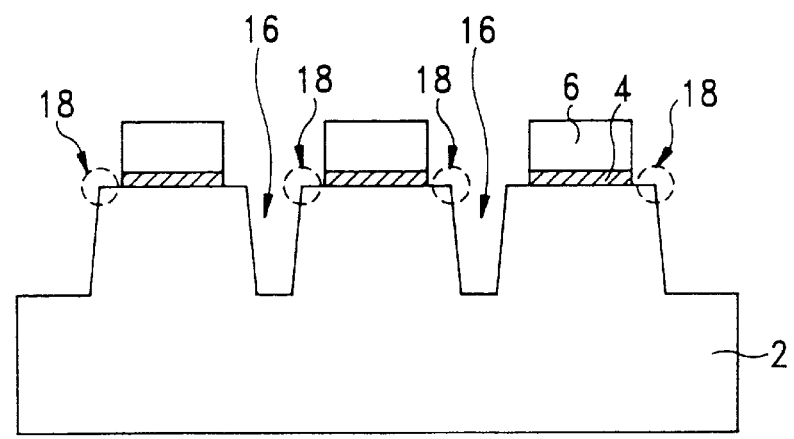
FIG. 6 is a cross section view of a semiconductor wafer illustrating the step of removing the oxide spacers in accordance with the present invention.

Turning next to FIG. 6, the silicon oxide layer 8 and the oxide spacers 14 are respectively removed by wet etching. Generally speaking, the oxide 8, 14 can be stripped by using an HF solution or a BOE (buffer oxide etching) solution. Further, the pad oxide 4 that is not covered by the silicon nitride layer 6 is also removed during the wet etching. Please note that the corners 18 of the trenches openings are sharp after these procedures.

Figure 7:
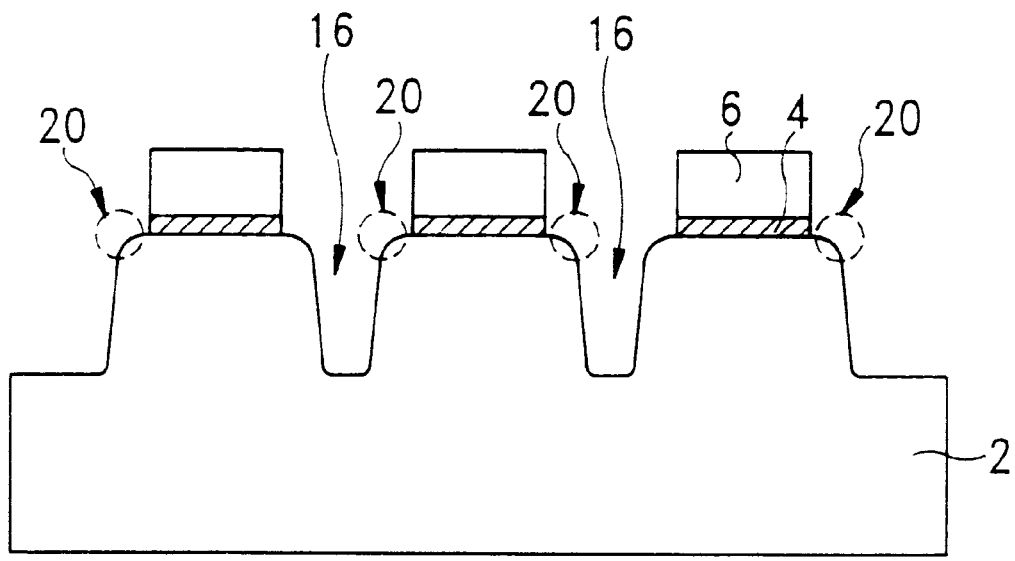
FIG. 7 is a cross section view of a semiconductor wafer illustrating the step of performing a thermal oxidation in accordance with the present invention.

Next, a thermal oxidation is performed to round the corners 18 of the trench openings. As shown in the FIG. 7, the corners 20 are now rounded. The thermal oxidation is carried out in an oxygen ambient at a temperature of about 950 to 1150 degrees centigrade.

Figure 8:
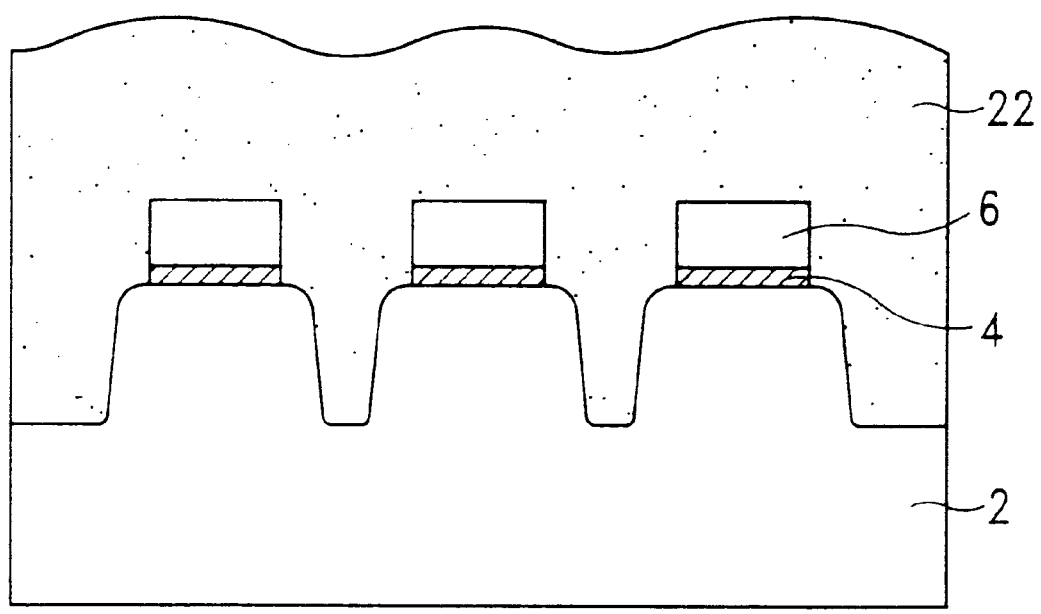
FIG. 8 is a cross section view of a semiconductor wafer illustrating the step of forming gap filling material in accordance with the present invention.

As depicted in FIG. 8, a gap filling material 22, such as oxide formed by a CVD system, which is referred to as CVD-oxide, is refilled into the trenches 16 and formed on the silicon nitride layer 6 for isolation. Preferably, the oxide layer 10 is formed at a temperature in the range of about 400 to 600 degrees centigrade.

Figure 9:
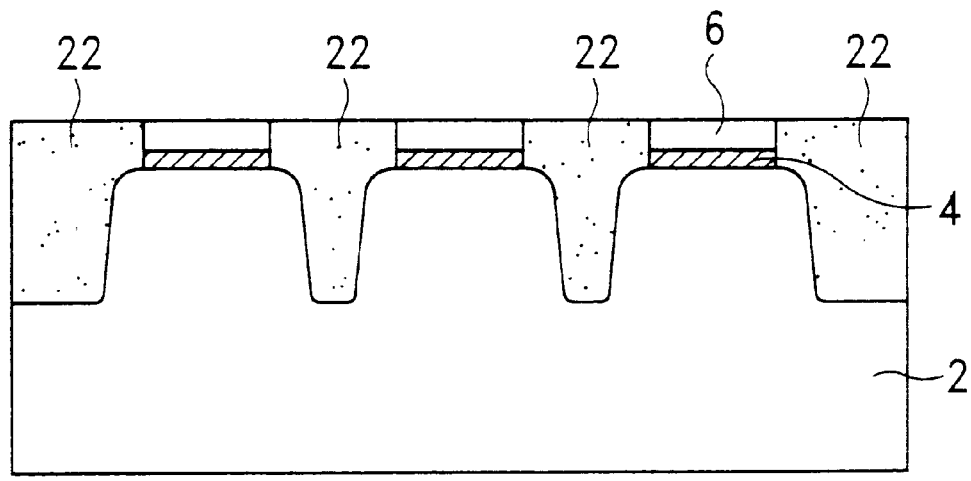
FIG. 9 is a cross section view of a semiconductor wafer illustrating the step of performing a chemical mechanical polishing in accordance with the present invention.
Figure 10:
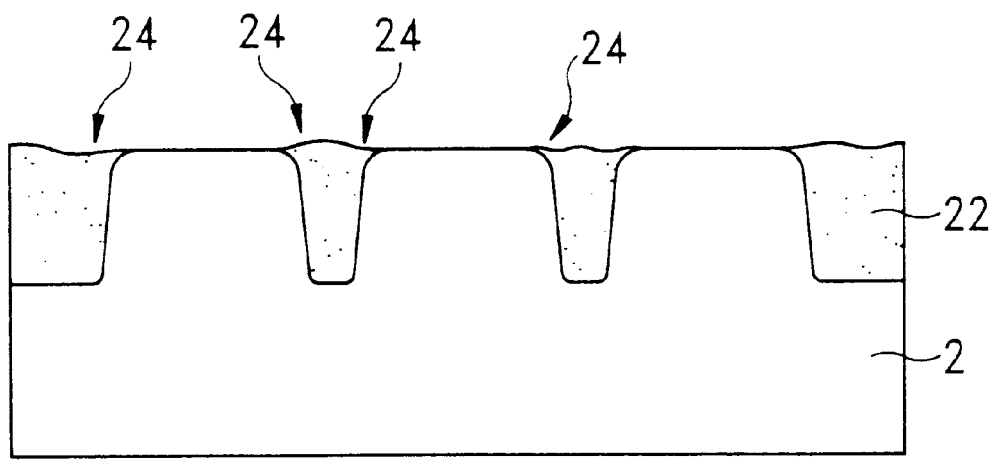
FIG. 10 is a cross section view of a semiconductor wafer illustrating the steps of removing the silicon nitride layer, pad oxide layer in accordance with the present invention.

Referring next to FIG. 9, a chemical mechanical polishing (CMP) technology is used to remove the top of the CVD-oxide 22 and the silicon nitride layer 6. A residual silicon oxide layer 6 still remains over the wafer 2. Turning next to FIG. 10, the residual silicon nitride layer 6 is removed by hot phosphorus acid solution. Next, the wafer is immersed in a wet etching solution to remove the gap filling material 22 over the surface of the wafer 2. This will further remove the CVD-oxide 22 and the pad oxide 6, thereby creating trench isolation structures with rounded corners 24. Preferably, the oxide can be stripped by using a HF solution or a BOE (buffer oxide etching) solution.

As is understood by a person skilled in the art, the foregoing preferred embodiment of the present invention is merely illustrative of the present invention. It is intended to cover various modifications and similar arrangements included within the spirit and scope of the appended claims, the scope of which should be accorded the broadest interpretation so as to encompass all such modifications and similar structure. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming trench isolations in a silicon wafer, said method comprising:

forming a first oxide layer on said silicon wafer to act as a pad oxide layer;

forming a silicon nitride layer on said pad oxide;

forming a second oxide layer on said silicon nitride layer;

forming a silicon oxynitride layer on said second oxide layer;

patterning said silicon oxynitride layer, said second oxide layer and said silicon nitride layer to expose said first oxide layer to define areas for forming said trenches;

forming oxide spacers on the side walls of said said second oxide layer and said silicon nitride layer, wherein said silicon oxynitride layer being removed during the formation of said oxide spacers;

etching said wafer to generate said trenches by using said second oxide layer, said silicon nitride layer and said oxide spacers as an etching mask;

removing said oxide spacers and said second oxide layer, leaving said silicon nitride layer and said first oxide layer over said wafer;

performing a thermal oxidation step for rounding the corners of said trenches;

forming a gap filling material refilled into said trenches and over said silicon nitride and said first oxide layer;

performing a chemical mechanical polishing to remove a portion of said gap filling material and leaving a portion of said silicon nitride layer and said first oxide layer over said wafer;

removing said portion of said silicon nitride layer; and immersing said wafer in a wet etching solution to remove a portion of said gap filling material over a surface of wafer, and removing said portion of said first oxide layer, thereby generating said trench isolations with rounding corners.

2. The method of claim 1, wherein said first oxide layer comprises silicon oxide.

3. The method of claim 1, wherein said second oxide layer comprises silicon oxide.

4. The method of claim 1, wherein said oxide spacers are removed by using HF solution.

5. The method of claim 1, wherein said oxide spacers are removed by using BOE solution.

6. The method of claim 1, wherein said silicon oxynitride layer is removed by an isotropical etching.

7. The method of claim 1, wherein said silicon nitride layer is removed by hot phosphorus acid solution.

8. The method of claim 1, wherein said second oxide layer is removed by HF solution.

9. The method of claim 1, wherein said second layer is removed by BOE solution.

10. The method of claim 1, wherein said pad oxide layer is removed by HF solution.

11. The method of claim 1, wherein said pad oxide layer is removed by BOE solution.

12. The method of claim 1, wherein said gap filling material is removed by HF solution.

13. The method of claim 1, wherein said gap filling material is removed by BOE solution.

14. The method of claim 1, wherein said thermal oxidation is performed at a temperature about 950 to 1150 degrees centigrade.

15. The method of claim 1, wherein said thermal oxidation is performed in an ambient containing oxygen.

* * * * *

UNITED STATES PATENT AND TRADEMARK OFFICE
CERTIFICATE OF CORRECTION

PATENT NO. : 6,001,704
DATED : December 14, 1999
INVENTOR(S) : H.-L. Cheng et al.

It is certified that error appears in the above-identified patent and that said Letters Patent is hereby corrected as shown below:

COLUMN   LINE

4            48            insert --layer-- after "oxide"
(Claim 1,    line 5)

5            11            After "generating" delete "said"
(Claim 1,    line 31)

Signed and Sealed this

Sixth Day of February, 2001

Attest:

Attesting Officer

Q. TODD DICKINSON
Director of Patents and Trademarks